(12) United States Patent  
Sarin

(10) Patent No.: US 8,098,530 B2  
(45) Date of Patent: Jan. 17, 2012

(54) SYSTEMS AND METHODS FOR ERASING A MEMORY

(75) Inventor: Vishal Sarin, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 498 days.

(21) Appl. No.: 12/271,185

(22) Filed: Nov. 14, 2008

(65) Prior Publication Data

US 2010/0124127 A1 May 20, 2010

(51) Int. Cl.
- *G11C 16/06* (2006.01)
- *G11C 16/10* (2006.01)
- *G11C 16/14* (2006.01)
- *G11C 16/16* (2006.01)

(52) U.S. Cl. ......... 365/185.29; 365/185.17; 365/185.18; 365/185.22; 365/185.3

(58) Field of Classification Search ............. 365/185.17, 365/185.18, 185.22, 185.29, 185.3
See application file for complete search history.

(56) References Cited

U.S. PATENT DOCUMENTS

| | | | | |
|---|---|---|---|---|
| 7,251,158 | B2 * | 7/2007 | Hsia et al. | 365/185.03 |
| 7,397,706 | B2 * | 7/2008 | Byeon et al. | 365/185.29 |
| 2005/0254306 | A1 * | 11/2005 | Wang | 365/185.22 |
| 2006/0140012 | A1 * | 6/2006 | Wan et al. | 365/185.29 |
| 2006/0221660 | A1 | 10/2006 | Hemink et al. | |
| 2007/0047327 | A1 * | 3/2007 | Goda et al. | 365/185.29 |
| 2007/0047328 | A1 * | 3/2007 | Kim | 365/185.29 |
| 2008/0285355 | A1 * | 11/2008 | Lee | 365/185.33 |

FOREIGN PATENT DOCUMENTS

WO WO 2008/048798 A1 4/2008

OTHER PUBLICATIONS

N. Ajika et al. "A 5 Volt Only 16M Bit Flash EEPROM Cell With a Simple Stacked Gate Structure", LSI Research and Development Laboratory Mitsubishi Electric Corporation, IEEE, 1990 pp. 4.

* cited by examiner

*Primary Examiner* — J. H. Hur
(74) *Attorney, Agent, or Firm* — Leffert Jay & Polglaze, P.A.

(57) ABSTRACT

Methods of erasing a memory, methods of operating a memory, memory devices, and systems. In one such method, an erase block is erased to an intermediate erase voltage before it is erased to a final erase voltage, such as to tighten an erase distribution. Faster erasing cells have their erasing throttled using a positive bias on their access line once a particular number of cells coupled to the access line are erased to the intermediate erase voltage.

20 Claims, 5 Drawing Sheets

SYSTEMS AND METHODS FOR ERASING A MEMORY

RELATED APPLICATIONS

This application is related to co-pending patent application titled "ERASE VOLTAGE REDUCTION IN A NON-VOLATILE MEMORY DEVICE", U.S. Ser. No. 12/271,223, filed on Nov. 14, 2008, and commonly assigned.

FIELD

The present disclosure relates generally to memories, and in particular the present disclosure relates to systems and methods for erasing memories.

BACKGROUND

Erasing a block (e.g., a grouping of cells, such as those cells located between sense circuitry of a memory device) of cells in a memory device is typically performed by selecting a particular block to erase. For the block to be erased, an access line, such as those typically referred to as word lines, have a bias of 0 volts applied thereto, and high voltage pulses are applied to the entire substrate. To inhibit programming on non-selected blocks, the word lines of the non-selected blocks have a high voltage applied thereto, so there is a small or zero potential difference between the word lines and the substrate. Since there is a significant potential difference between word lines on selected blocks and the substrate, those cells are erased.

Typically, a series of erase pulses of increasing magnitude are applied to the selected block, as not all cells erase at the same rate, e.g., with the same erase pulse. After each erase pulse, a verification sequence is performed to verify the level to which cells on the selected erase block are erased. In a multiple level cell, it is often desired to erase to an erase voltage of less than −3 volts, for example. Since some cells erase faster than others, successive erase pulses can over-erase cells to a voltage substantially less than the desired erase voltage, in some cases erasing cells to as low as −7 volts, for example.

In multiple level cell memories, where the number of potential data states (e.g., representing a number of bits) per cell are increasing, cell disturb can become a large issue. If cells are erased to substantially lower than the typical erase voltage, then upon programming those over-erased cells, a jump in voltage for a cell to be programmed can require programming a cell from, for example, −7 volts all the way to, for example, +4 volts or more. In a situation such as this, there are many potential coupling issues between the cell being programmed and adjacent cells, horizontally, vertically, and diagonally. The greater the movement in voltage between an erased cell and its programmed potential, the worse the potential coupling issues.

For the reasons stated above, and for other reasons stated below which will become apparent to those skilled in the art upon reading and understanding the present specification, there is a need in the art for reducing erase distributions in memories, for example.

DETAILED DESCRIPTION

Figure 1:
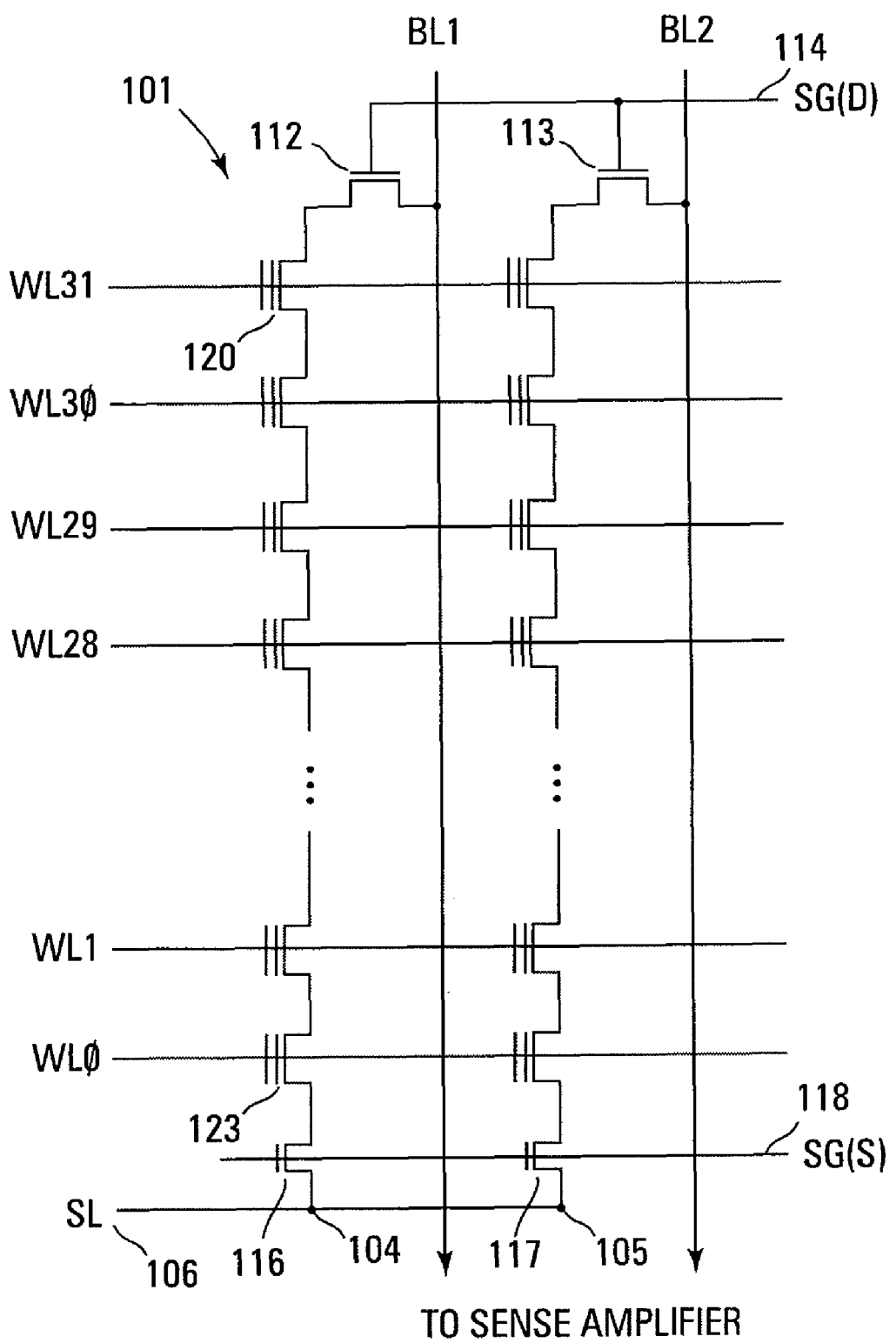
FIG. 1 is a schematic diagram of one embodiment of series NAND strings of memory cells.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

The embodiments of the present disclosure can provide a reduced, which is sometimes referred to as a tightened, erase distribution for multi level cell (MLC) memories. The tightened erase distribution can help reduce program disturb issues in MLC memories. For example, in one or more embodiments, cells coupled to access lines of the selected block to be erased are erased to a first, intermediate erase voltage. When a particular number of cells coupled to an access line in the selected block are erased to the intermediate erase voltage, that access line is "throttled", that is erasing is slowed down, using a positive bias applied to that access line for successive erase pulses. When all access lines have been throttled, erasing is then completed to a standard, final erase voltage. This can tighten the erase voltage distribution of the cells in the selected erase block.

FIG. 1 illustrates a schematic diagram of a portion of a NAND architecture memory array 101 comprising series strings of non-volatile memory cells on which one embodiment of the method for erasing can be used. While FIG. 1 and the subsequent discussions refer to a NAND memory device, the present embodiments are not limited to such an architecture but can be used in other memory device architectures as well.

The memory array is comprised of an array of non-volatile memory cells 101 (e.g., floating gate) arranged in columns such as series strings 104, 105. Each of the cells 101 are coupled drain to source in each series string 104, 105. An access line (e.g. word line) WL0-WL31 that spans across multiple series strings 104, 105 is connected to the control gates of each memory cell in a row in order to bias the control gates of the memory cells in the row. The data lines (e.g., bit lines) BL1, BL2 are eventually connected to sense amplifiers (not shown) that detect the state of each cell by sensing current on a particular bit line.

Each series string 104, 105 of memory cells is coupled to a source line 106 by a source select gate 116, 117 and to an individual bit line BL1, BL2 by a drain select gate 112, 113. The source select gates 116, 117 are controlled by a source select gate control line SG(S) 118 coupled to their control gates. The drain select gates 112, 113 are controlled by a drain select gate control line SG(D) 114.

Each memory cell can be programmed as a single level cell (SLC) or multilevel cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC may have multiple $V_t$ windows that each indicate a different state. Multilevel cells can take advantage of the analog nature of a traditional flash cell by assigning a bit pattern to a specific voltage range stored on the cell. This technology permits the storage of two or more bits per cell, depending on the quantity of voltage ranges assigned to the cell.

Figure 2:
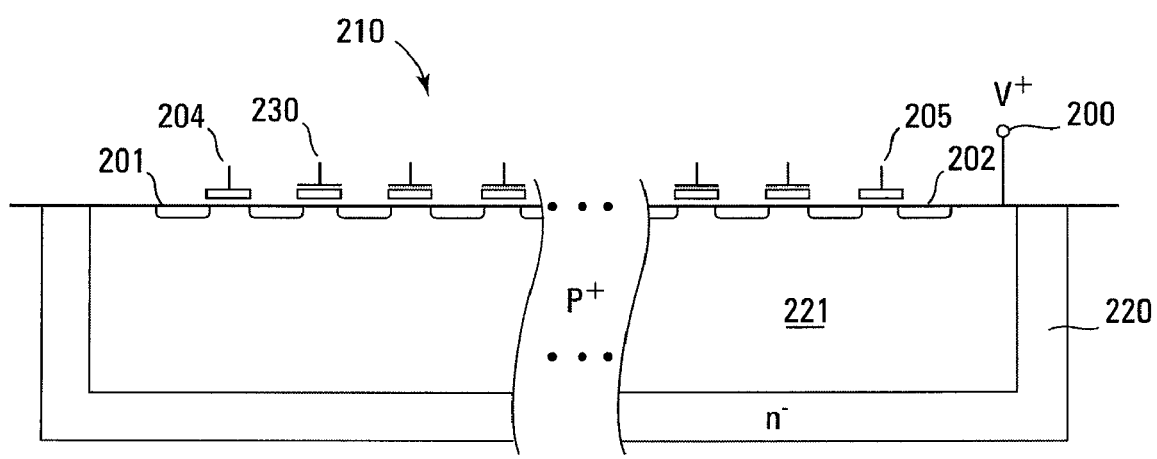
FIG. 2 is a cross sectional view of one embodiment of a substrate p-well that contains at least one block of non-volatile memory cells.

FIG. 2 illustrates a cross sectional view of one embodiment of a semiconductor tub in a substrate. The illustrated tub, also referred to in the art as a well, is comprised of a p-type material 221 (e.g., silicon) that is substantially surrounded by an n-type material 220. The n-type material 220 isolates the well from the remainder of the substrate elements. Alternate embodiments can use opposite doping of the tub and surrounding isolating material.

The block of memory cells to be erased is formed in the p-well. In one embodiment, more than one block of memory cells can be formed in the p-well. FIG. 2 also shows a cross sectional view of one series NAND string of memory cells. The memory block is comprised of a plurality of series strings of memory cells 210, as illustrated in FIG. 1, formed between a source line 201 and a drain line 202. Access to the source line 201 is controlled by the select gate source transistor 204. Access to the drain line 202 and thus the bit line is controlled by the select gate drain transistor 205. As illustrated in FIG. 1, the series connected memory cells 230 are located between the select gate source transistor 204 and the select gate drain transistor 205.

Figure 3:
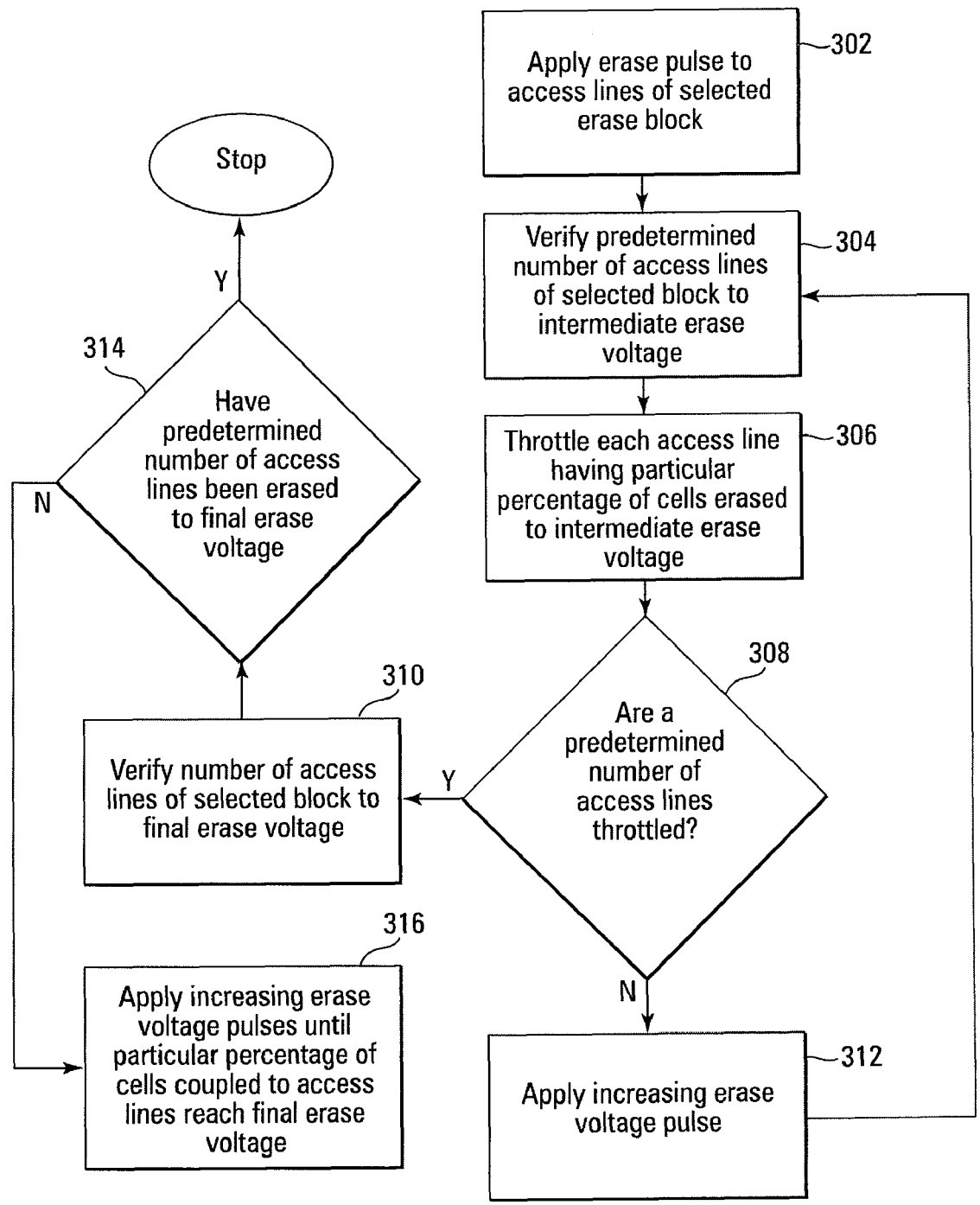
FIG. 3 is a flow chart diagram of a method according to one embodiment of the present invention.

A method 300 for erasing an erase block in a memory is shown in greater detail in FIG. 3. A first erase pulse is applied to the well of the selected block (e.g., by applying to the substrate, for example) to be erased in block 302. The memory cells coupled to each access line of the block are verified at a first erase voltage to determine whether at least a particular number of the cells coupled to the access line are erased to the first erase voltage in block 304. Each access line having the particular number of cells erased to the first erase voltage is throttled in block 306. If a predetermined number of access lines of the erase block are throttled as determined in decision block 308, the process proceeds to verify whether the number of access lines has been erased to a final erase voltage at block 310. If not, a next, higher voltage erase pulse is applied at block 312, and the process repeats at block 304. Decision block 314 determines whether the predetermined number of access lines have been erased to a final erase voltage. If they have, the process stops. If not, increasing erase voltage pulses are applied in block 316 until a particular percentage of cells coupled to the access lines have been erased to their final erase voltage.

The first erase voltage in one embodiment is an intermediate voltage higher than the final erase voltage. For example, if the final voltage to which cells are to be erased is −3 volts, an intermediate erase voltage may be −2.5 volts. The particular number of cells coupled to an access line that are erased to the intermediate erase voltage before throttling the access line can be determined based on a number of factors, and can vary based on the intended usage of the memory.

Throttling in one embodiment comprises slowing down erasing of the cells coupled to the throttled access line. In one embodiment, this is accomplished by applying a positive bias to the access line to be throttled, so that the potential difference between the magnitude of the successive voltage pulses and the access line potential is smaller than for non-throttled access lines. After each successive voltage pulse, the access lines are re-checked, and any further access lines having the particular number (e.g., a percentage, such as a majority) of cells having reached the intermediate voltage are throttled. Once all access lines are throttled, the access lines are verified to the final verify voltage, for example −3 volts. The throttling of access lines slows down the erasing of those cells that erase faster than other cells, and can tighten the erase distribution so that final erased voltages for cells are closer to the final erase voltage. It should be understood that in other embodiments, a different throttle voltage can be applied after each successive erase pulse. For example, after a first erase pulse, a throttle voltage may be 1.0 volts, and after a second erase pulse, a throttle voltage may be 2.0 volts. Further, cells that erase initially to −1.5 volts may be throttled at 1.0 volts, and cells erased to −2.5 may be throttled at 2.0 volts, and the like. This can further tighten the erase voltage distribution.

In one embodiment, the positive bias applied to throttle access lines is adjustable (e.g., trimmable), that is the positive bias is sufficient to slow erasing without completely inhibiting erasing for the cells. In one embodiment, the throttle positive bias is approximately 0.5-1.0 volts.

Figure 4:
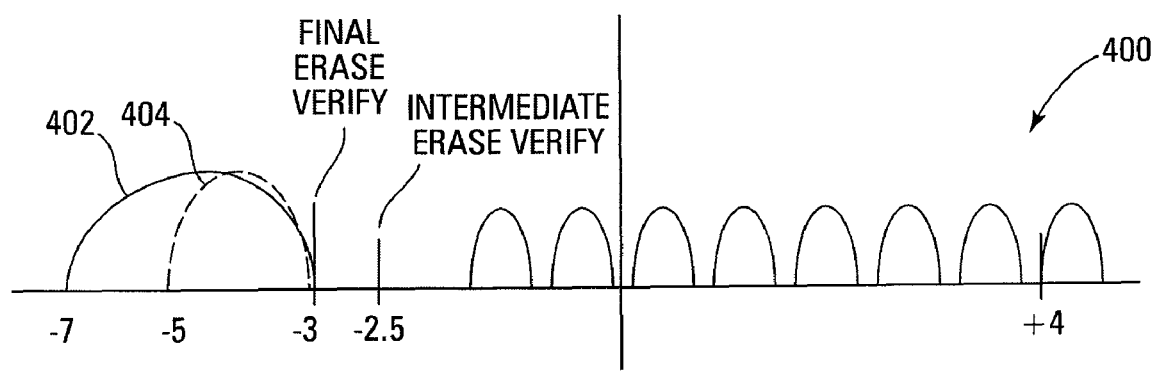
FIG. 4 is a diagram of an erase distribution according to one embodiment of the present invention.

FIG. 4 shows a representation 400 of an expected typical erase distribution 402 for an erase block without using a throttling process as described above. An expected typical erase distribution for an erase block using a throttling process as described above is shown as dashed line 404. The distribution is tighter, with the cells erased to a lowest voltage higher than those of a non-throttled process. The intermediate erase voltage is shown as −2.5 volts, and the final erase voltage as −3 volts, although it should be understood that those values are only representative, and will depend upon the actual memory to which the process is applied.

Figure 5:
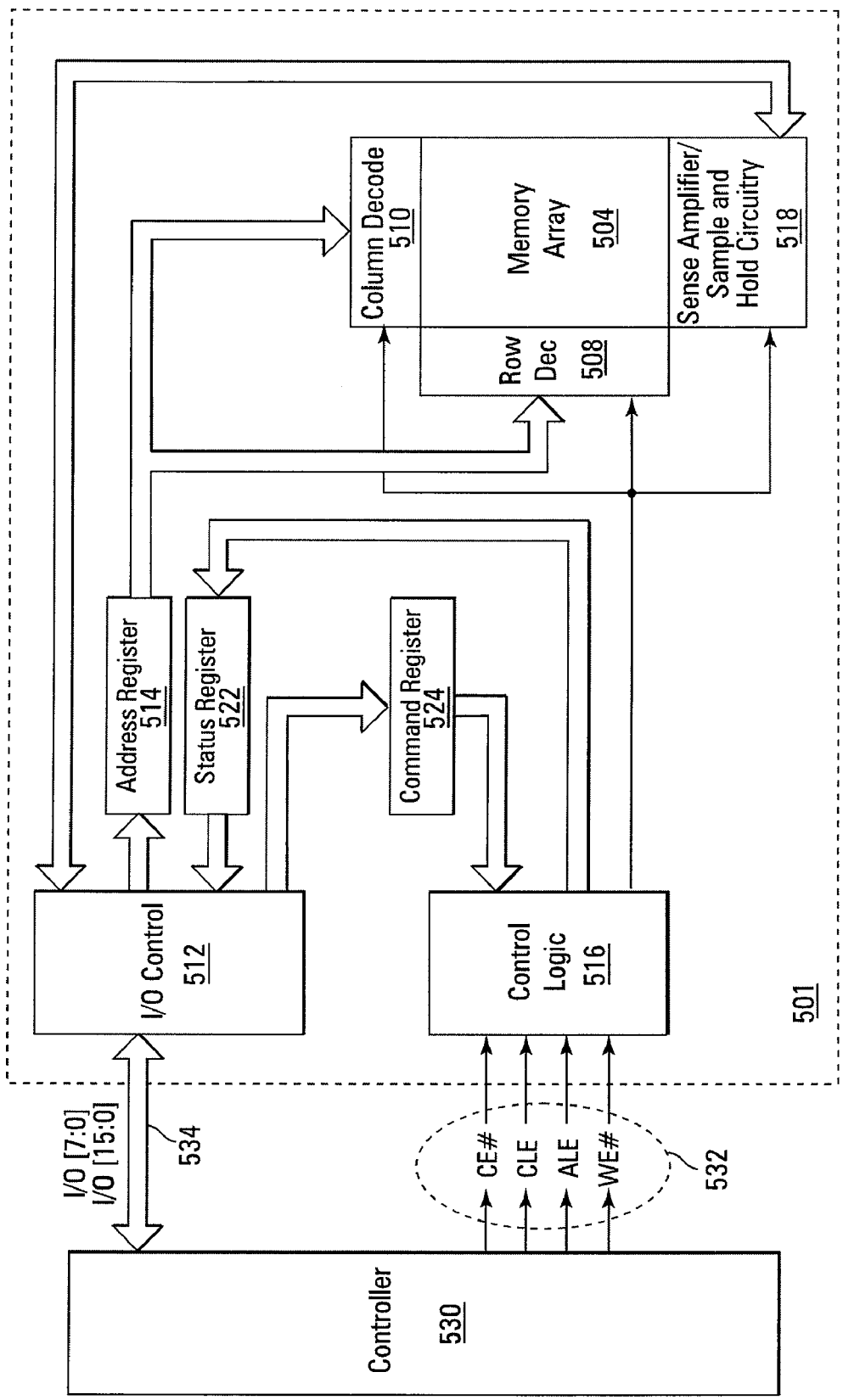
FIG. 5 is a functional block diagram of an electrical system having at least one memory device with a memory array configuration according to one embodiment of the present invention.

FIG. 5 is a simplified block diagram of a memory device 501 according to an embodiment of the disclosure. Memory device 501 includes an array of memory cells 504 organized in rows and columns. Although the various embodiments will be described primarily with reference to NAND memory arrays, the various embodiments are not limited to a specific architecture of the memory array 504. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 508 and a column decode circuitry 510 are provided to decode address signals provided to the memory device 501. Address signals are received and decoded to access memory array 504. Memory device 501 also includes input/output (I/O) control circuitry 512 to manage input of commands, addresses and data to the memory device 501 as well as output of data and status information from the memory device 501. An address register 514 is coupled between I/O control circuitry 512 and row decode circuitry 508 and column decode circuitry 510 to latch the address signals prior to decoding. A command register 524 is coupled between I/O control circuitry 512 and control logic 516 to latch incoming commands. Control logic 516 controls access to the memory array 504 in response to the commands and generates status information for the external processor 530. The control logic 516 is coupled to row decode circuitry 508 and column decode circuitry 510 to control the row decode circuitry 508 and column decode circuitry 510 in response to the addresses.

Control logic 516 is also coupled to sense amplifier/sample and hold circuitry 518. The sense amplifier/sample and hold circuitry 518 latches data, either incoming or outgoing, in the form of analog signal levels (e.g., voltage levels). For example, the sense amplifier/sample and hold circuitry 518 could contain capacitors or other analog storage devices for sampling either an incoming voltage signal representing data to be written to a memory cell or an outgoing voltage signal indicative of the threshold voltage sensed from a memory cell. The sense amplifier/sample and hold circuitry 518 may further provide for amplification and/or buffering of the sampled voltage to provide a stronger data signal to an external device.

It should be understood that sense amplifier/sample and hold circuitry 518 can be replaced with digital data latches, and the read/write channel can be replaced with a digital read/write channel, sending digital data bits from the I/O to the data latches, without departing from the scope of the invention.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog signal using a differential amplifier having a grounded input or other reference signal as a second input. The output of the differential amplifier could then be passed to the I/O control circuitry 512 for output from the memory device, in the case of a read operation, or used for comparison during one or more verify operations in programming the memory device. It is noted that the I/O control circuitry 512 could optionally include analog-to-digital conversion functionality and digital-to-analog conversion (DAC) functionality to convert read data from an analog signal to a digital bit pattern and to convert write data from a digital bit pattern to an analog signal such that the memory device 501 could be adapted for communication with either an analog or digital data interface.

During a write operation, target memory cells of the memory array 504 are programmed until voltages indicative of their $V_t$ levels match the levels held in the sense amplifier/sample and hold circuitry 518. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the $V_t$ levels of the target memory cells are passed to the sense amplifier/sample and hold circuitry 518 for transfer to an external processor (not shown in FIG. 5) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sense amplifier/sample and hold circuitry 518 may include caching, i.e., multiple storage locations for each data value, such that the memory device 501 may be reading a next data value while passing a first data value to the external processor, or receiving a next data value while writing a first data value to the memory array 504. A status register 522 is coupled between I/O control circuitry 512 and control logic 516 to latch the status information for output to the external processor.

Memory device 501 receives control signals at control logic 516 over a control link 532. The control signals may include a chip enable CE#, a command latch enable CLE, an address latch enable ALE, and a write enable WE#. Memory device 501 may receive commands (in the form of command signals), addresses (in the form of address signals), and data (in the form of data signals) from an external processor over a multiplexed input/output (I/O) bus 534 and output data to the external processor over I/O bus 534.

In a specific example, commands are received over input/output (I/O) pins [7:0] of I/O bus 534 at I/O control circuitry 512 and are written into command register 524. The addresses are received over input/output (I/O) pins [7:0] of bus 534 at I/O control circuitry 512 and are written into address register 514. The data may be received over input/output (I/O) pins [7:0] for a device capable of receiving eight parallel signals, or input/output (I/O) pins [15:0] for a device capable of receiving sixteen parallel signals, at I/O control circuitry 512 and are transferred to sense amplifier/sample and hold circuitry 518. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 5 has been simplified to help focus on the embodiments of the disclosure.

An erase function on the memory 500 is performed on selected blocks as described above, with access lines being throttled as the particular percentage of their cells being erased to the intermediate erase voltage is met.

Additionally, while the memory device of FIG. 5 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 534. Because the data signals represent bit patterns instead of individual bits, serial communication of an 8-bit data signal could be as efficient as parallel communication of eight signals representing individual bits.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface.

CONCLUSION

Methods to tighten an erase distribution, and memories on which the methods can be practiced, have been described that include throttling access lines in an erase block once a particular number of cells coupled to the access line have been erased to an intermediate erase voltage higher than a final erase voltage. Throttling comprises in one embodiment applying a positive bias to those access lines having the particular number of cells erased to the intermediate erase voltage. Throttling can be performed on successive erase pulses until a predetermined number of access line of the erase block have been throttled, at which point the erase block is verified to the final erase voltage.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of erasing in a memory, comprising:
throttling an access line of a selected erase block during an erase operation when at least a particular number of cells coupled to the access line are erased to an intermediate erase voltage before the cells are erased to their final erase voltage;
wherein throttling further comprises:
applying an erase pulse to the selected erase block;
determining whether at least the particular number of cells coupled to the access line are verified as being erased to the intermediate erase voltage; and
applying a bias voltage to the access line if at least the particular number of cells are verified as being erased to the first intermediate erase voltage.

2. The method of claim 1, wherein throttling an access line comprises:
applying a bias to the access line.

3. The method of claim 1, wherein applying a bias voltage comprises applying a bias of approximately 0.5 to 1.0 volts.

4. The method of claim 1, wherein the intermediate erase voltage is approximately −2.5 volts.

5. The method of claim 1, wherein the final erase voltage is approximately −3.0 volts.

6. A method of operating a memory, comprising:
applying an erase pulse to a predetermined number of access lines in a selected erase block;
applying a bias voltage to each access line of the erase block that has at least a particular number of cells coupled to it erased to an intermediate erase voltage;
applying an other erase pulse having a higher voltage to the selected erase block;
wherein the method is repeated until all access lines of the block have the particular number of cells erased to the intermediate erase voltage, which is higher than a final erase voltage.

7. The method of claim 6, wherein the at least a number of cells is a majority of cells coupled to the access line.

8. The method of claim 7, wherein the bias voltage is adjustable depending upon the erase voltage to which the cells have been verified.

9. The method of claim 6, wherein applying a bias voltage comprises applying a bias of approximately 0.5 to 1.0 volts.

10. The method of claim 6, and further comprising:
determining whether at least the number of cells coupled to each of the access lines is erased to an intermediate erase voltage; and
erasing the cells of the selected erase block to the final erase voltage after all of the access lines of the block have at least the particular number of their respective cells erased to the intermediate erase voltage.

11. The method of claim 10, wherein the final erase voltage is lower than the first intermediate erase voltage.

12. A method of erasing a block in a memory device, comprising:
applying a first erase pulse to the block;
determining whether a number of cells coupled to access lines of the block are verified as being erased to a first erase voltage;
slowing down erasing associated with subsequent erase pulses for those of the access lines determined to have at least the number of cells erased to the first erase voltage;
repeating the applying through slowing down acts until a predetermined number of the access lines of the erase block are determined to have at least the number of cells verified as being erased to the first erase voltage; and
erasing the erase block to a second erase voltage lower than the first erase voltage.

13. The method of claim 12, wherein slowing down erasing comprises applying a positive bias to those of the access lines determined to have at least the number of cells verified as being erased to the first erase voltage.

14. A memory device, comprising:
an array of memory cells;
circuitry for control and/or access of the array of memory cells, the control circuitry configured to perform a method comprising:
throttling an access line of a selected erase block when at least a particular number of the cells coupled to the access line are verified as being erased to a first erase voltage; and
erasing to a final erase voltage lower than the first erase voltage after a predetermined number of the access lines of the selected erase block are throttled.

15. The memory device of claim 14, wherein the control circuitry is further configured to throttle an access line to be throttled by applying a positive bias of approximately 0.5 to 1.0 volts to the access line to be throttled.

16. The memory device of claim 14, wherein the control circuitry is further configured to erase to a first erase voltage of approximately −2.5 volts and to a final erase voltage of approximately −3.0 volts.

17. A system, comprising:
a processor; and
a memory device coupled to the processor to store data provided by the processor and to provide data to the processor, the memory comprising:
an array of memory cells;
circuitry for control and/or access of the array of memory cells, the control circuitry configured to perform a method comprising:
throttling an access line of a selected erase block during an erase operation when at least a number of cells coupled to the access line are verified as being erased to an intermediate erase voltage; and
erasing the selected block to a final erase voltage after all of the access lines in the selected erase block are throttled.

18. The system of claim 17, wherein the control circuitry is further configured to apply a bias voltage to the access line to throttle the access line.

19. The system of claim 17, the control circuitry is further configured to apply an erase pulse to the selected erase block, determine whether at least a particular number of cells coupled to the access line are erased to the first erase voltage, apply a bias voltage to each access line having at least the particular number of cells erased to the first erase voltage, and repeat the applying and determining acts until all of the access lines of the selected blocks are determined to have at least the number of cells erased to the first erase voltage.

20. The memory device of claim 17, wherein the control circuitry is further configured to throttle access lines having different intermediate erase voltages with different bias voltages.

* * * * *

UNITED STATES PATENT AND TRADEMARK OFFICE
CERTIFICATE OF CORRECTION

PATENT NO. : 8,098,530 B2  
APPLICATION NO. : 12/271185  
DATED : January 17, 2012  
INVENTOR(S) : Vishal Sarin Page 1 of 1

It is certified that error appears in the above-identified patent and that said Letters Patent is hereby corrected as shown below:

IN THE CLAIMS:

In column 10, line 16, in Claim 20, delete "memory device" and insert -- system --, therefor.

Signed and Sealed this  
Thirteenth Day of March, 2012

David J. Kappos  
*Director of the United States Patent and Trademark Office*